United States Patent

[11] 3,574,285

[72] Inventors Alarico A. Valdettaro;
Joe G. Badger, Bloomington, Ind.
[21] Appl. No. 815,898
[22] Filed Apr. 14, 1969
[45] Patented Apr. 13, 1971
[73] Assignee Sarkes Tarzian, Inc.
Bloomington, Ind.

[54] UHF TUNER DRIVE MECHANISM
8 Claims, 7 Drawing Figs.

[52] U.S. Cl. .......... 74/10.52, 74/409, 74/798, 334/85
[51] Int. Cl. .......... F16h 35/18
[50] Field of Search .......... 74/10.52, 10.5, 10.8, 409, 798; 334/85

[56] References Cited

UNITED STATES PATENTS

| | | | |
|---|---|---|---|
| 1,977,289 | 10/1934 | Scofield | 74/409X |
| 2,095,279 | 10/1937 | Newman | 74/10.52 |
| 3,188,872 | 6/1965 | Weiner | 74/10.52 |
| 3,447,386 | 6/1969 | Berenbaum et al. | 74/10.8 |

*Primary Examiner*—Milton Kaufman
*Attorney*—Mason, Kolehmainen, Rathburn & Wyss

ABSTRACT: The control shaft and dial indicator shaft of the UHF tuner are mounted in bearings positioned on opposite ends of the tuner housing. The rear bearing comprises a ball-planetary speed reduction unit which is electrically isolated from both shafts. A high viscosity lubricant is employed between shafts and in the front bearing to provide a shaft-mounting arrangement which has the feel of a precision bearing.

INVENTORS:
ALARICO A. VALDETTARO
JOE G. BADGER

By Mason, Kolehmainen
Rathburn & Wyss
Attorneys

INVENTORS:
ALARICO A. VALDETTARO
JOE G. BADGER
By Mason, Kolehmainen
Rathburn & Wyss
Attorneys

UHF TUNER DRIVE MECHANISM

The present invention relates to UHF tuners, and, more particularly, to a drive mechanism for rotating the main tuning shaft of the UHF tuner at low speed while providing for dial indication of the station to which the UHF tuner is tuned.

Various arrangements have heretofore been proposed for driving the main tuning shaft of the UHF tuner at relatively slow speed to provide coverage for all of the UHF stations in a particular area while providing a suitable drive arrangement for a dial indicator which will indicate the particular station to which the UHF tuner is tuned. In general, these drive mechanisms have been mounted on the same side of the UHF tuner housing as the UHF main tuning shaft and the UHF tuner assembly is mounted on a metal panel or plate which is attached to the front of the television cabinet. One of the problems which arises in such tuner drive mechanisms is that a substantial side thrust may be exerted on the control and dial indicator shafts of the drive mechanism but the space which is conventionally available between the tuner housing and the front panel is insufficient to provide rigid shaft supports for the control shaft and dial indicator shaft of the UHF tuner which will resist such side thrusts.

Also, in conventional UHF tuner drive mechanisms which are mounted directly on a metal panel attached to the front of the television receiver cabinet, since the UHF tuner housing is connected to ground it is necessary to insulate not only the control shaft and dial indicator shaft of the UHF tuner drive mechanism, but also the mounting arrangement for the UHF tuner drive arrangement must also be insulated in order to comply fully with underwriters' requirements so that user of the television set cannot touch any portion of the UHF tuner or UHF tuner drive mechanism which is connected to ground and which may be electrically hot depending upon the particular design of the television receiver. Usually, the UHF tuner drive mechanism is insulated from the metal mounting plate by means of rubber grommets but since the mounting screws are themselves connected to the UHF tuner housing, it is also necessary to insulate these mounting screws by means of fish paper barriers, or the like.

A further disadvantage of present-day UHF tuner drive mechanisms is that since these drive mechanisms are made at low cost for mass production use, they do not provide expensive mounting bearings for the UHF tuner control shaft and dial indicator shaft with the result that there is considerable slop and play in the shaft bearings which prevent the drive mechanism from being actuated smoothly to provide precise alignment of the main tuning shaft to a desired UHF station, as would be the case with precision-type bearings.

Furthermore, while various speed reduction mechanisms have been employed in conventional tuner drive mechanisms, these speed reduction units have in general not been compatible with the requirements for insulation of the shafts for compliance with underwriter regulations. However, it is desirable to provide a tuner drive mechanism which is completely free from play so that the main tuning shaft may be reset to a desired UHF station many times without changing the dial indication.

It is, therefore, an object of the present invention to provide a new and improved UHF tuner drive mechanism in which one or more of the above-discussed disadvantages of prior art arrangements is eliminated.

It is another object of the present invention to provide a new and improved UHF tuner drive mechanism in which the control shaft and dial indicator shaft of the UHF tuner, as well as the mounting arrangements whereby the tuner is mounted in the cabinet, are all electrically insulated from the UHF tuner housing.

It is another object of the present invention to provide a new and improved UHF tuner drive mechanism which is particularly designed to resist side thrust on the control shaft and dial indicator shaft of the UHF tuner.

It is a further object of the present invention to provide a new and improved tuner drive mechanism wherein a ball-planetary speed reduction unit is provided while maintaining the control shaft and dial indicator shaft of the drive mechanism electrically isolated from the UHF tuner housing.

It is a still further object of the present invention to provide a new and improved UHF tuner drive mechanism wherein the control shaft of the drive mechanism is mounted in relatively wide tolerance bearings while providing a control shaft mounting arrangement which has the feel of a precision bearing mounting arrangement.

It is another object of the present invention to provide a new and improved UHF tuner drive mechanism wherein substantially all backlash is removed between the control shaft and the main UHF tuning shaft of the UHF tuner drive mechanism.

It is a further object of the present invention to provide a new and improved UHF tuner drive mechanism wherein a ball-planetary speed reduction unit also acts as one of the journals for the control shaft and dial indicator shaft of the UHF tuner drive mechanism.

Briefly, in accordance with one phase of the invention, the control shaft and dial indicator shaft of the UHF tuner drive mechanism are mounted in bearings which are positioned on opposite ends of the UHF tuner housing to provide a rigid support for the shafts which will resist side forces exerted thereon. The rear mounting journal comprises a ball-planetary speed reduction mechanism which is electrically isolated from the control shaft and the dial indicator shaft of the drive mechanism. The front bearing for the shaft comprises a nylon mounting block which insulatingly supports the UHF tuner and its associated drive mechanism. Spring-loaded spur gears are employed to interconnect the dial indicator shaft and the main tuning shaft of the UHF tuner, which together with the ball-planetary unit provides a completely play-free drive connection between the control shaft and the main UHF tuning shaft and the dial indicator shaft. A high viscosity lubricant is employed between the control shaft and the dial indicator shaft and in the front bearing for the shafts to achieve a mounting for the control shaft which has the feel of a precision bearing arrangement.

The invention, both as to its organization and method of operation, together with further objects and advantages thereof, will best be understood by reference to the following specification taken in connection with the accompanying drawings in which.

Figure 1:
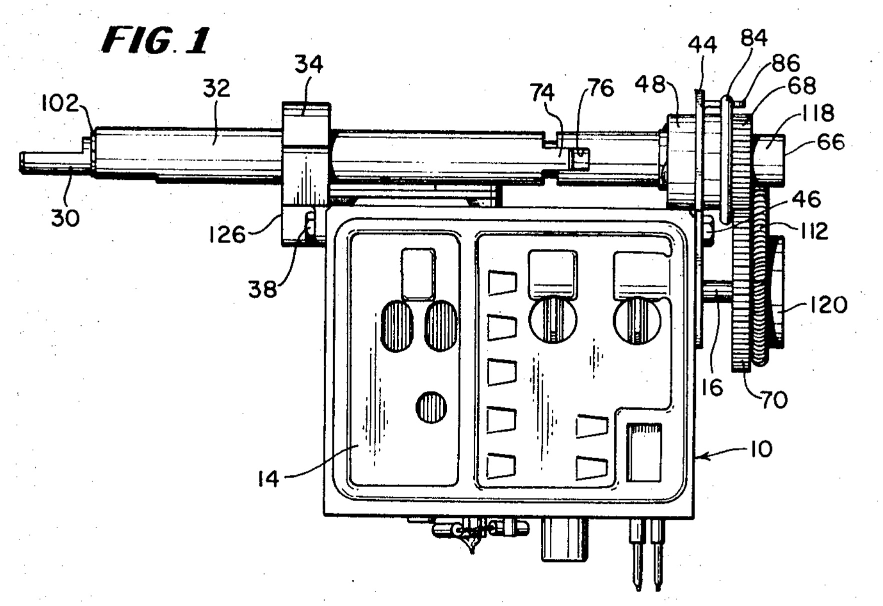
FIG. 1 is a right side elevational view of a UHF tuner provided with a drive mechanism embodying the principles of the present invention.

Referring now to the drawings, the UHF tuner drive mechanism of the present invention is shown in association with a UHF tuner, indicated generally at 10, this tuner comprising a shallow rectangular housing 12 the open side of which is shielded by means of a metallic cover member 14. The main UHF tuning shaft 16 of the UHF tuner 10 extends rearwardly from the rear end wall 18 of the housing 12 through an opening 20 provided in this end wall. While the UHF tuner 10 may comprise any suitable arrangement for selecting UHF stations insofar as the present invention is concerned, in the illustrated embodiment a number of rotor plates 22, 24 and 26 are positioned in different tuning compartments of the housing 12 and are electrically connected to the main tuning shaft 16 which is grounded to the housing 12, as will be readily understood by those skilled in the art. The housing 12 is normally connected to ground when the UHF tuner is assembled in the television receiver and in situations where the television receiver employs a hot chassis, the housing 12 may also be hot and therefore must be electrically isolated from the portions of the UHF tuner drive mechanism which are accessible to the operator.

The UHF tuner drive mechanism provided for rotating the main tuning shaft 16 at a relatively slow speed to permit selection of individual UHF television stations, comprises a UHF control shaft 30 which is arranged to extend through a suitable opening in the television receiver cabinet and has a control knob (not shown) connected thereto for operation by the television set operator.

A dial indicator shaft 32 is mounted concentrically with the control shaft 30 and is arranged to be interconnected to a suitable dial indicator hub or dial indicator cord arrangement. As discussed generally heretofore, considerable side thrust may be exerted on the shaft 32, due to the associated dial indicating arrangement, and other circumstances.

In order to mount the shafts 30 and 32 in a manner such that they will be able to resist side thrust exerted thereon while at the same time providing an arrangement by means of which the UHF tuner may be mounted relatively close to the front panel of the television cabinet, a front mounting block 34 is secured to the front end wall 36 of the UHF tuner housing 12, by means of a screw 38, and is also secured to the top wall 40 of the housing 12 by means of a screw 42. The rear mounting journal for the shafts 30 and 32 is in the form of a bracket 44 which is secured to the rear end wall 18 of the housing 12 by means of a screw 46 and is provided with a forwardly extending annular flange portion 48 which forms the ball race of a ball-planetary speed reduction unit to be described in more detail hereinafter.

In order to insulate the front end of the control shaft 30 electrically, the rear end of this control shaft is provided with a recess in which is positioned a coupler member 50, preferably of nylon or other suitable insulating material, this coupler member being provided with an end flange 52 which seats on the end of the control shaft 30. The nylon coupler 50 is provided with a rearwardly extending bore within which is positioned the knurled shank portion 54 of a ball-planetary drive member, which is preferably made of hardened drill rod material, this member being provided with an intermediate flange 56 which is seated on the flange 52 of the nylon coupler 50 when the shank portion 54 is press fitted into the coupler 50. With such an arrangement, the drive member is rigidly connected to the control shaft 30.

The rear end of the drive member is provided with a conical drive portion 58 which is urged into engagement with a series of three drive balls 60 by means of a coil spring 62. The spring 62 is seated in a recess 64 formed in a member 66 which is preferably of nylon or other suitable insulating material. The member 66 acts as the rear section of the dial indicator shaft 32 and also acts as a ball cage for the balls 60. Furthermore, the member 66 is provided with integrally formed spur gear teeth 68 which mesh with the teeth of a spur gear 70, also of insulating material, which is connected to the main tuning shaft 16 by means of the set screw 72. The dial indicator shaft 32 is interconnected with the member 66 by means of tongue portions 74 which engage in corresponding slots 76 provided in the forward end of the member 66.

Figure 2:
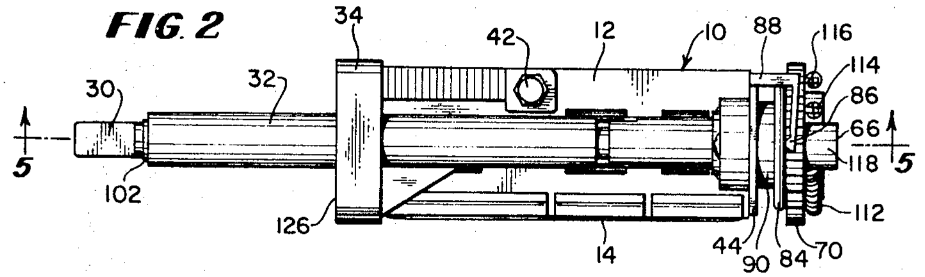
FIG. 2 is a top view of the tuner of FIG. 1.
Figure 3:
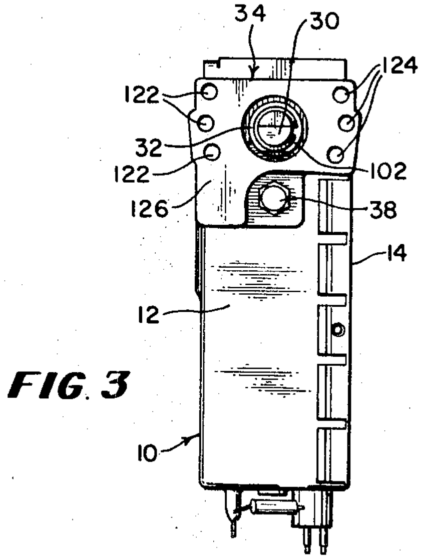
FIG. 3 is a front view of the tuner of FIG. 1.

The coil spring 62, which is bottomed in the end wall of the recess 64, engages the end of the conical drive member 58 through a small ball 80 which bears on the end of the conical drive portion 58. Each of the drive balls 60 extends through a ball cage opening 82 formed in the member 66 and rides on the inner surface of the annular flange portion 48 of the rear journal member 44. The inner surface of the annular flange 48 thus acts as a ball race for the ball-planetary speed reduction unit. The member 66 is retained in position by engagement of a radially projecting flange portion 84 thereof, with a retainer arm 86 (FIG. 2) which is integrally connected to the journal member 44 by means of an intermediate portion 88. The enlarged flange portion 90 of the member 66, in which the gear teeth 68 are formed, is of sufficient diameter to engage the rear surface of the mounting journal 44 so that the member 66 is held in position between the bracket 44 and the retaining arm 86.

The dial indicator shaft 32 is rotatably mounted in an opening 92 which is formed in the mounting block 34, and a forwardly opening recess 94 is provided in the block 34 which is adapted to receive a retaining washer 96 which seats on an inwardly extending flange portion 98 of the block 34. The control shaft 30 is provided with a groove 100 within which is positioned a C-washer 102 which engages the end of the dial indicator shaft 32. With this arrangement, rearward pressure which may be exerted on the control shaft 30 by the operator is transmitted through the C-washer 102 and the dial indicator shaft 32 to the retaining washer 96 which bears against the flange 98 of the block 34. As a result, rearward pressure on the control shaft 30 cannot be transmitted to the member 66 in such manner as to bend the retaining arm 86 which is of relatively light material. However, when it is desired to disassemble the ball-planetary drive mechanism, the arm 86 may be bent outwardly beyond the edge of the flange 84 thereby permitting the entire drive member 66 and its associated parts to be removed from the flange ball race 48. The retaining arm 86 also functions to prevent rearward creep of the ball-planetary mechanism due to the fact that the ball race formed by the inner surface of the flange 48 cannot be exactly parallel to the shafts, but is slightly conical facing rearwardly due to the forming die in which the flange 48 is formed.

Considering now the operation of the ball-planetary speed reduction arrangement described thus far, when the control shaft 30 is rotated, the conical drive portion 58, which is pressed into engagement with the balls 60 by means of the coil spring 62, is likewise rotated and rotates these balls at a speed reduction ratio determined by the shape of the conical drive portion 58 in relation to the diameter of the balls 60. As the balls 60 are rotated, they rotate the drive member 66 by engagement with the sides of the ball cage openings 82 therein so that the gear portion 68 of the member 66 is driven at reduced speed in response to rotation of the control shaft 30. Rotation of the gear 68 is transmitted through the gear 70 to the main tuning shaft 16 of the UHF tuner 10 so as to provide for selection of a particular UHF television station. Rotation of the member 66 is also transmitted forwardly through the tongue and groove connection 74, 76 to the dial indicator shaft 32 so as to provide for rotation of this shaft corresponding to the rotation of the main tuning shaft 16. Since the main tuning shaft 16 is normally rotated over only approximately 180° to select all UHF television stations, the gear ratios of the gears 68, 70 is so chosen that the dial indicator shaft 32 will be rotated through the desired arc corresponding to a particular dial indicating arrangement, as will be readily understood by those skilled in the art.

It will be noted that while the rear journal bracket 44 is electrically connected to the housing 12, and hence the drive portion 58 is also electrically connected to this housing through the balls 60, the control shaft 30 is insulated electrically from the housing 12 by means of the intermediate coupler 50 of insulating material. Accordingly, the control shaft 30 is electrically isolated from the housing 12 to conform to underwriters' requirements. Also, it will be noted that the ball-planetary speed reduction arrangement acts as a rear bearing support for the control shaft 30. This is because the conical drive portion 58 is continuously urged into engagement with the balls 60 which are in turn urged outwardly against the flange 48. It will also be noted that the dial indicator shaft 32 is likewise electrically isolated from the UHF tuner housing 12. This is because the shaft 32 is rotatably mounted on the control shaft 30 which is itself electrically isolated and the further fact that the control shaft 32 engages only the end of the drive member 66 which is of insulated material.

In order to provide a positive stop for the UHF tuner drive mechanism which is effective to prevent the exertion of excessive torque on the UHF main tuning shaft 16, a rearwardly extending tongue portion 104 is provided in the bracket 44, this tongue portion extending into a semicircular recess 106 provided in the forward face of the gear 70. With this arrangement, when the control shaft 30 has been rotated by an amount sufficient to move the main tuning shaft 16 to one of the extreme positions of this tuning shaft, the stop 104 engages one of the ends 108 or 110 of the slot 106 and absorbs any excessive torque which may thereafter be exerted on the control shaft 30, thus preventing the application of excessive torque to the main tuning shaft 16.

Figure 4:
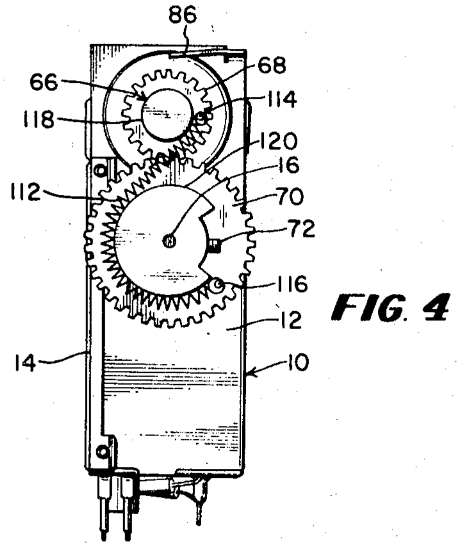
FIG. 4 is a rear view of the tuner of FIG. 1.
Figure 5:
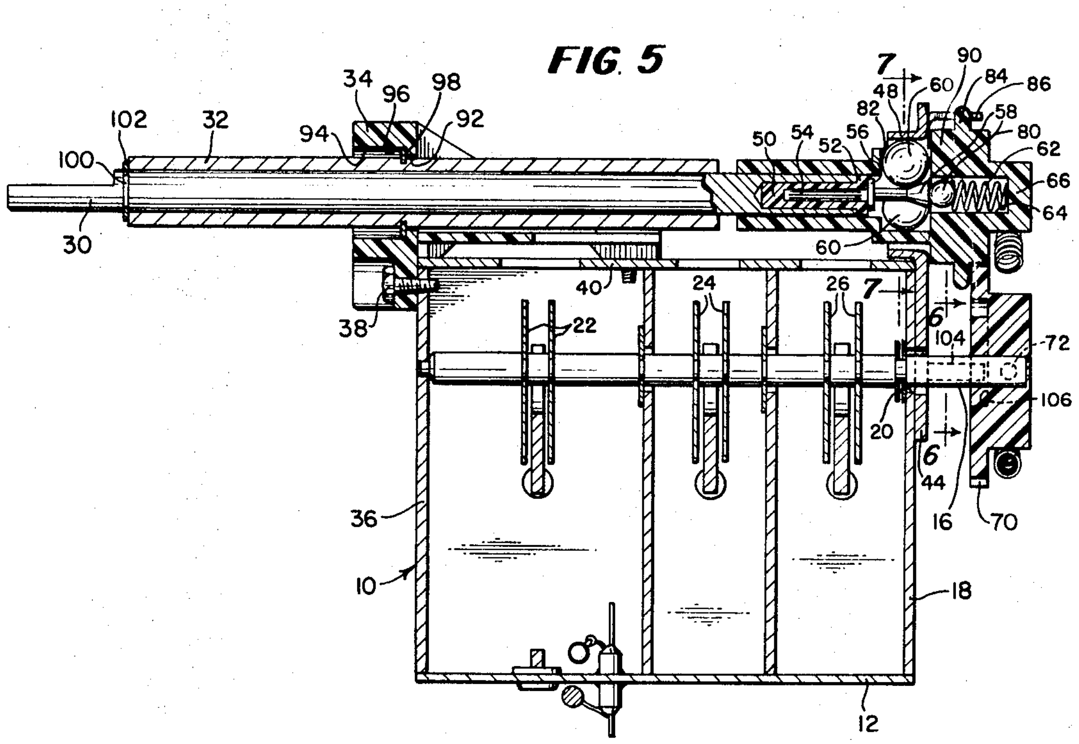
FIG. 5 is a sectional view taken along the line 5–5 of FIG. 2 on a somewhat larger scale.
Figure 6:
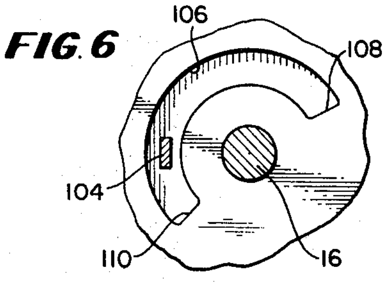
FIG. 6 is a fragmentary sectional view taken along the line 6–6 of FIG. 5.
Figure 7:
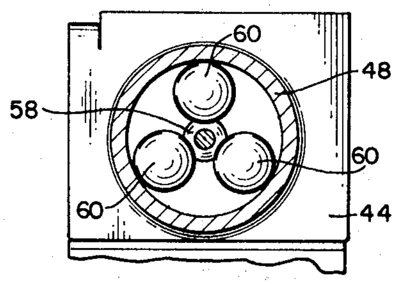
FIG. 7 is a fragmentary sectional view taken along the lines 7–7 of FIG. 5.

In order to provide a UHF tuner drive mechanism which is entirely play free, it is necessary to remove backlash between the gears 68 and 70. In accordance with a further aspect of the invention, this backlash is removed by means of a tension coil spring 112, one end of which is connected to a rearwardly extending lug portion 114 on the member 66 and the other end of which is connected to a rearwardly extending lug portion 116 formed in the gear 70. As best illustrated in FIG. 4, the member 66 is provided with a rearwardly projecting hub portion 118 about which the coil spring 112 may be wound, and the gear 70 is also provided with a rearwardly extending hub portion 120 about which the coil spring 112 may be wound. The diameters of the hub portions 118 and 120 are chosen such that the coil spring 112 will be wound about arcs of circles which have the same ratio as the ratio of the pitch diameters of the gears 68, 70. Accordingly, the coil spring 112 will remain of constant length as the gears 68, 70 are rotated and hence will maintain a constant pressure on these gears so as to remove all backlash from the system. Furthermore, such antibacklash action will be achieved for both directions of rotation of the gears 68, 70 since the coil spring 112 urges one side of the teeth of these gears into engagement continuously and is stronger than the normal rotative force exerted on the control shaft 30. Since the ball-planetary drive arrangement provided by the conical drive portion 58 and the balls 60 is likewise completely free from play, it will be evident that the arrangement of the present invention permits rotation of the shaft 30 to achieve the desired tuning to a particular UHF station completely free from play and backlash in the intervening drive mechanism. In this connection it will be noted that the above-described antibacklash action of the coil spring 112 is made possible due to the fact that the dial indicator shaft 32, and hence the member 66 is rotated somewhat less than 360°. Accordingly, the coil spring 112 may be wrapped around substantially the entire periphery of the hub portion 118 as the dial indicator shaft 32 is rotated through its full range of travel.

In order that the entire UHF tuner assembly may be mounted in an electrically isolated manner on the conventional mounting panel or plate in the television receiver cabinet, the front mounting block 34 is provided with a series of bores 122 and 124 which extend rearwardly from the flat front mounting surface 126 of the block 34. A particular pair of the mounting holes 122, 124 may be chosen in accordance with a desired orientation of the UHF tuner assembly in the television cabinet, and self-tapping screws may be inserted into the selected bores 122, 124 so as to rigidly mount the block 34 on the mounting panel. It will be noted that since these mounting screws extend only into the block 34 which is of insulating material, it is not necessary to shield the mounting screws themselves to meet underwriters' requirements. Furthermore, since the block 34 is of insulating material the entire UHF tuner and its drive mechanism is electrically isolated from the mounting plate which supports it. In addition, as discussed heretofore, both the shaft 30 and the shaft 32 are also electrically isolated from the tuner housing 12.

In order to provide a mounting arrangement for the shaft 30 which has the feel of a precision bearing system, the space between the shafts 30 and 32 and the space between the opening 92 and the shaft 32 is filled with extremely high-viscosity lubricant, preferably having a viscosity in the order of 300,000 centipoises. With such a lubricant the control shaft 30 may be smoothly actuated at extremely low speeds for precise alignment to the desired UHF station.

While but a single embodiment of the present invention has been here specifically disclosed, it will be apparent that many variations may be made therein, all within the true spirit and scope of the invention.

We claim:

1. The combination of a drive mechanism and a UHF tuner of the type having a rectangular metallic housing and a main UHF tuning shaft extending from one wall thereof, comprising a central control shaft, a dial indicator shaft concentric with said control shaft, first and second brackets mounted on two opposing sides of said main housing, said control shaft and said dial indicator shaft being rotatably mounted in said brackets in substantially parallel relation to said main UHF tuning shaft, a planetary drive mechanism interconnecting said control shaft and said dial indicator shaft, a first spur gear connected to said UHF main tuning shaft and provided with a hub portion, a second spur gear formed in the end of said dial indicator shaft and provided with a hub portion, means defining a post on each of said first and second gears adjacent said hub portion, a coil spring connected to said posts at either end thereof and extending around said hub portions in such manner as to be wound from one hub to the other as said gears are rotated, said hub portions having diameters proportional to the corresponding gear diameters so that said coil spring maintains a constant length as it is wound from one of said hub portions to the other, thereby to maintain a constant pressure on said spur gears to remove backlash therefrom.

2. The combination of a drive mechanism and a UHF tuner of the type having a rectangular metallic housing and a main UHF tuning shaft extending from one wall thereof, comprising a central control shaft, a dial indicator shaft concentric with said control shaft, first and second brackets mounted on two opposing sides of said main housing, said control shaft and said dial indicator shaft being rotatably mounted in said brackets in substantially parallel relation to said main UHF tuning shaft, a cone-shaped drive member mounted in the end of said control shaft and electrically insulated therefrom, a plurality of apertures in said dial shaft, a ball positioned within each of said apertures, means defining a ball race, spring bias means for urging said cone-shaped drive member into engagement with said balls and said balls into engagement with said race, and gear means interconnecting said dial indicator shaft and said UHF main tuning shaft.

3. The combination of a drive mechanism and a UHF tuner of the type having a rectangular metallic housing and a main UHF tuning shaft extending from one wall thereof, comprising a central control shaft, a dial indicator shaft concentric with said control shaft and including a portion made of a material which is electrically nonconductive, first and second brackets mounted on two opposing sides of said main housing, said control shaft and said dial indicator shaft being rotatably mounted in said brackets in substantially parallel relation to said main UHF tuning shaft, a cone-shaped drive member connected to said control shaft, a plurality of apertures in said dial shaft, a ball positioned within each of said apertures, means defining a ball race, spring bias means for urging said cone-shaped drive member into engagement with said balls and said balls into engagement with said race, and gear means interconnecting said dial indicator shaft and said UHF main tuning shaft, said nonconductive portion being connected to said gear means.

4. The combination of a drive mechanism and a UHF tuner of the type having a rectangular metallic housing and a main UHF tuning shaft extending from one wall thereof, comprising a central control shaft, a dial indicator shaft concentric with said control shaft, first and second brackets mounted on two opposing sides of said main housing, means rotatably mounting said dial indicator shaft in said first bracket, said second bracket having means defining a ball race, a member of electrically insulating material connected to said dial indicator shaft and having a plurality of apertures therein and spur gear teeth formed therein, a ball positioned in each of said apertures, a cone-shaped drive member connected to said control shaft, spring bias means for urging said cone-shaped drive member into engagement with said balls and said balls into engagement with said race, a retaining arm on said second bracket and in engagement with said member to limit rearward movement of said member while permitting rotation thereof, and gear means connected to said UHF main tuning shaft and in engagement with said spur gear teeth of said member.

5. The combination as set forth in claim 4, wherein means are provided for limiting rearward movement of said dial indicator shaft to prevent bending of said retaining arm.

6. The combination of claim 4, wherein said retaining arm is bendable so as to permit movement thereof out of engagement with said member and disassembly of said member and balls from said second bracket.

7. The combination of a drive mechanism and a UHF tuner of the type having a rectangular metallic housing and a main UHF tuning shaft extending from one wall thereof, comprising a central control shaft electrically insulated from said housing, a dial indicator shaft concentric with said control shaft and electrically insulated from said housing, first and second brackets mounted on two opposing sides of said main housing, said control shaft and said dial indicator shaft being rotatably mounted in said brackets in substantially parallel relation to said main UHF tuning shaft, a planetary drive mechanism interconnecting said control shaft and said dial indicator shaft, and gear means interconnecting said dial indicator shaft and said UHF main tuning shaft.

8. The combination of a drive mechanism and a UHF tuner of the type having a rectangular metallic housing and a main UHF tuning shaft extending from one wall thereof, comprising a central control shaft, a dial indicator shaft concentric with said control shaft, first and second brackets mounted on two opposing sides of said main housing, said control shaft and said dial indicator shaft being rotatably mounted in said brackets in substantially parallel relation to said main UHF tuning shaft, a planetary drive mechanism interconnecting said control shaft and said dial indicator shaft, gear means interconnecting said dial indicator shaft and said UHF main tuning shaft, said control shaft and said dial indicator shaft having a relatively large clearance therebetween, and a high-viscosity lubricant positioned between said control shaft and said dial indicator shaft to simulate a close tolerance bearing arrangement for said control shaft.